United States Patent
Sato et al.

(10) Patent No.: US 11,506,295 B2
(45) Date of Patent: Nov. 22, 2022

(54) VALVE DEVICE, FLUID CONTROL DEVICE, FLUID CONTROL METHOD, SEMICONDUCTOR MANUFACTURING APPARATUS, AND SEMICONDUCTOR MANUFACTURING METHOD

(71) Applicant: FUJIKIN INCORPORATED, Osaka (JP)

(72) Inventors: Tatsuhiko Sato, Osaka (JP); Tomohiro Nakata, Osaka (JP); Tsutomu Shinohara, Osaka (JP); Takeru Miura, Osaka (JP)

(73) Assignee: FUJIKIN INCORPORATED, Osaka (JP)

( * ) Notice: Subject to any disclaimer, the term of this patent is extended or adjusted under 35 U.S.C. 154(b) by 0 days.

(21) Appl. No.: 17/259,329

(22) PCT Filed: Jun. 18, 2019

(86) PCT No.: PCT/JP2019/024000
§ 371 (c)(1),
(2) Date: Jan. 11, 2021

(87) PCT Pub. No.: WO2020/021911
PCT Pub. Date: Jan. 30, 2020

(65) Prior Publication Data
US 2021/0262577 A1 Aug. 26, 2021

(30) Foreign Application Priority Data
Jul. 24, 2018 (JP) .............................. JP2018-138284

(51) Int. Cl.
*F16K 7/16* (2006.01)
*C23C 16/455* (2006.01)
(Continued)

(52) U.S. Cl.
CPC .......... *F16K 7/16* (2013.01); *C23C 16/45544* (2013.01); *F16K 1/427* (2013.01); *F16K 27/0236* (2013.01); *H01L 21/67017* (2013.01)

(58) Field of Classification Search
CPC ......... C23C 16/45544; H01L 21/67017; F16K 1/42; F16K 1/44; F16K 1/443;
(Continued)

(56) References Cited

U.S. PATENT DOCUMENTS 2,627,387 A * 2/1953 Buickerood ............. F16K 7/16
251/363
5,485,984 A 1/1996 Itoi et al.
(Continued)

FOREIGN PATENT DOCUMENTS

AU 43696/68 2/1971
CN 101349355 6/2011
(Continued)

OTHER PUBLICATIONS

International Search Report, WIPO, Application No. PCT/JP2019/024000, dated Sep. 17, 2019, English translation.
(Continued)

*Primary Examiner* — Kevin F Murphy
*Assistant Examiner* — Jonathan J Waddy
(74) *Attorney, Agent, or Firm* — Greenblum & Bernstein, P.L.C.

(57) ABSTRACT

A valve device includes a valve body; a cylindrical member provided in an accommodation recess and communicating with the first flow path; a valve seat supported by the cylindrical member; a seal member interposed between the periphery of the opening of first flow path on the bottom surface of the accommodation recess and the lower end portion of the cylindrical member; an annular plate which is flexible, air-tightly or liquid-tightly fixed to an annular
(Continued)

support portion formed on the inner peripheral surface of the accommodation recess, air-tightly or liquid-tightly fixed to an annular support portion formed on the outer peripheral surface of the cylindrical member and has a plurality of openings communicating with the second flow path; and a diaphragm that moves between an open position at which the diaphragm does not contact the valve seat and a closed position at which the diaphragm contacts the valve seat.

12 Claims, 13 Drawing Sheets

(51) Int. Cl.
*F16K 27/02* (2006.01)
*H01L 21/67* (2006.01)
*F16K 1/42* (2006.01)

(58) Field of Classification Search
CPC ... F16K 1/446; F16K 7/14; F16K 7/16; F16K 7/18; F16K 11/044; F16K 15/14; F16K 15/1402; F16K 15/144; F16K 15/147; F16K 1/427; F16K 11/148; F16K 11/16; F16K 25/00; F16K 27/0236; F16K 43/008
USPC .......................................................... 251/331
See application file for complete search history.

(56) References Cited

U.S. PATENT DOCUMENTS

| | | |
|---|---|---|
| 2006/0214130 A1 | 9/2006 | Tanikawa et al. |
| 2009/0020722 A1 | 1/2009 | Masamura |
| 2014/0217321 A1 | 8/2014 | Glime |
| 2015/0292627 A1 | 10/2015 | Yamada |
| 2017/0184207 A1 | 6/2017 | Glime |
| 2020/0063875 A1 | 2/2020 | Doi et al. |
| 2021/0332900 A1* | 10/2021 | Sato ......................... F16K 7/17 |

FOREIGN PATENT DOCUMENTS

| | | |
|---|---|---|
| CN | 104870872 | 8/2015 |
| CN | 110857734 | 3/2020 |
| JP | H06-193747 A | 7/1994 |
| JP | 2005-172026 A | 6/2005 |
| JP | 2016/505125 A | 2/2016 |

OTHER PUBLICATIONS

Written Opinion, WIPO, Application No. PCT/JP2019/024000, dated Sep. 17, 2019, English translation.
International Preliminary Report on Patentability, WIPO, Application No. PCT/JP2019/024000, dated Jan. 26, 2021, English translation.
Chinese Office Action, China Patent Office, Chinese Patent Application No. 201980049272.1, dated Mar. 29, 2022 (with English translation).

* cited by examiner

[fig.1A]
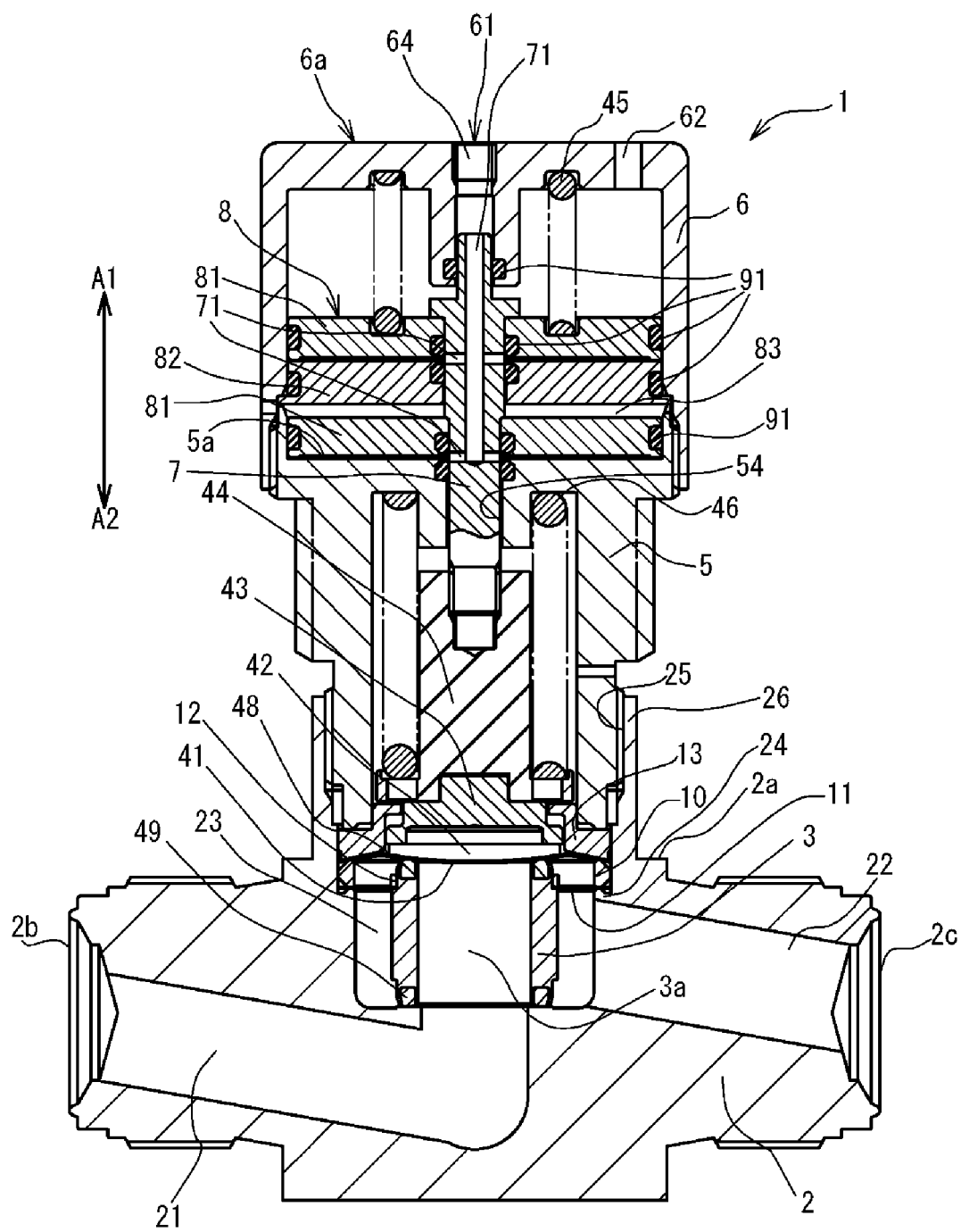

[fig.1B]
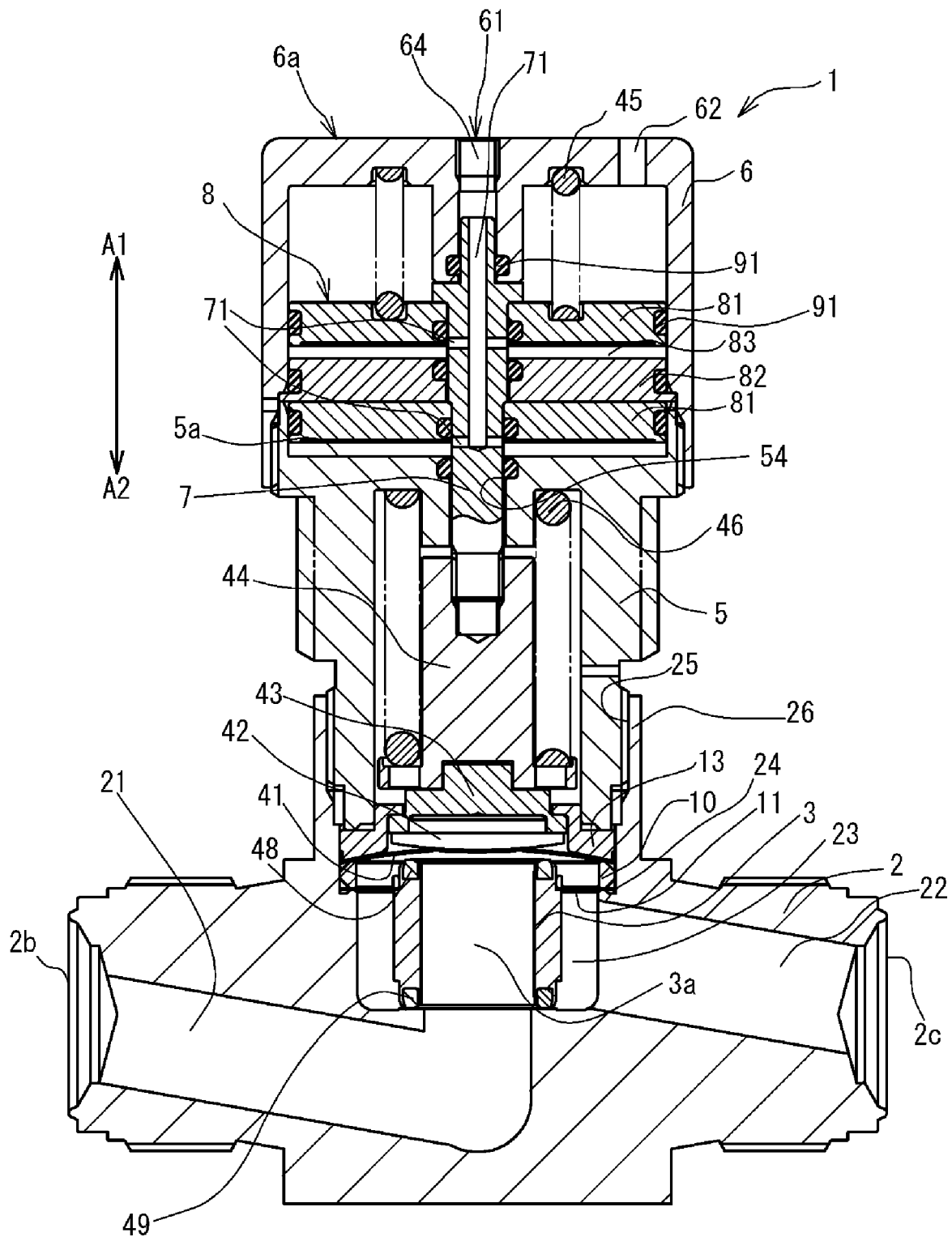

[fig.2A]
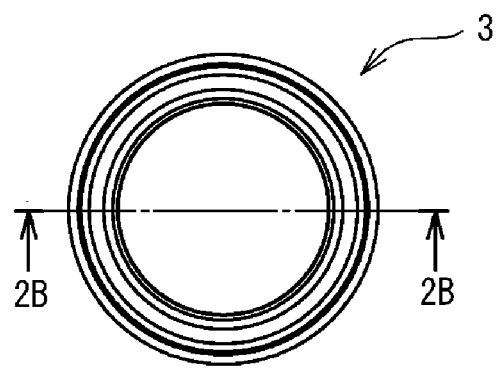
[fig.2B]
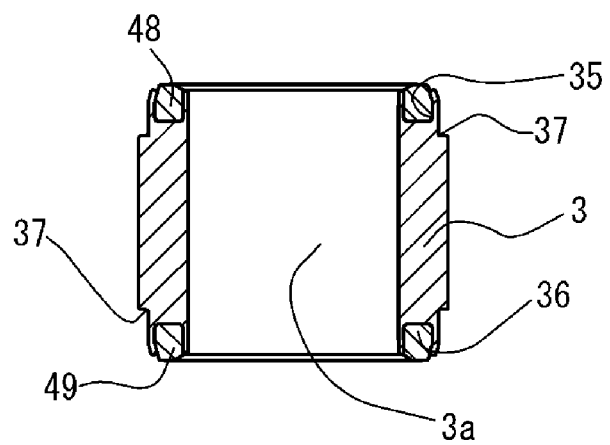

[fig.3]
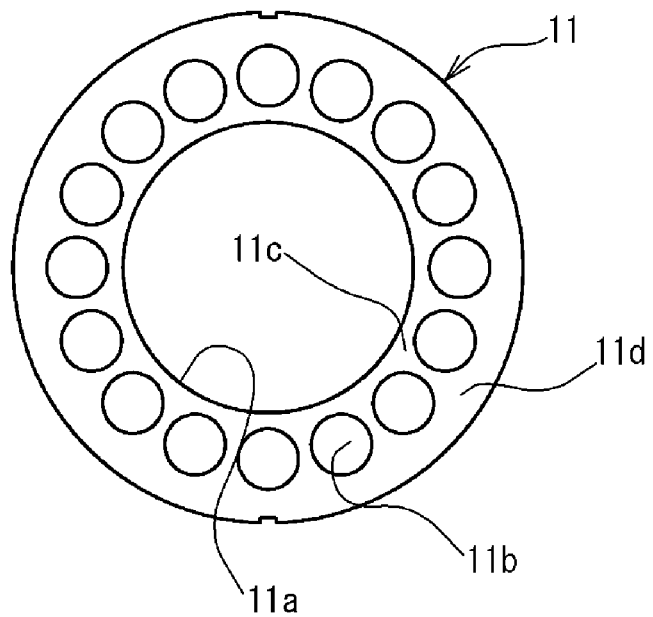
[fig.4A]
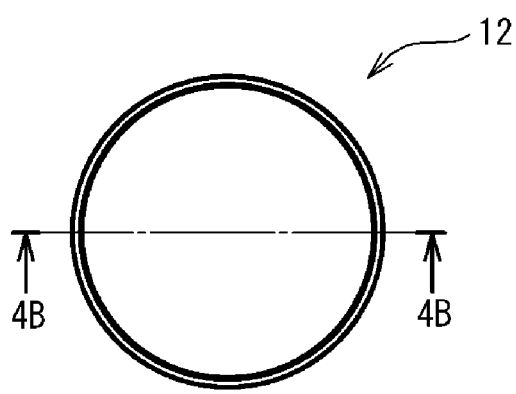
[fig.4B]
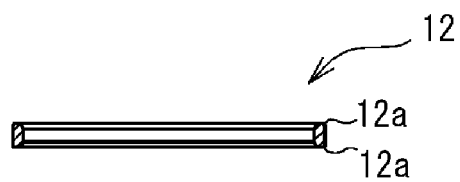

[fig.5]
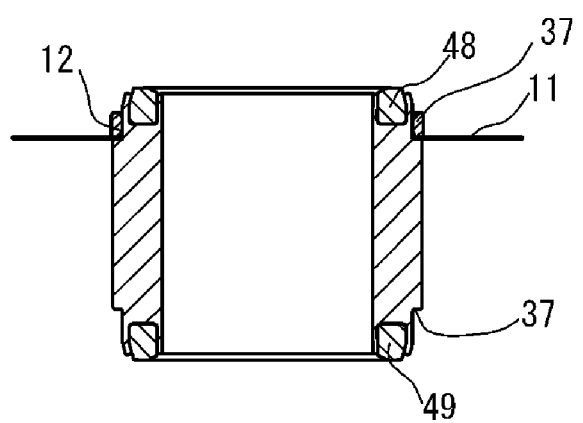

[fig.6]
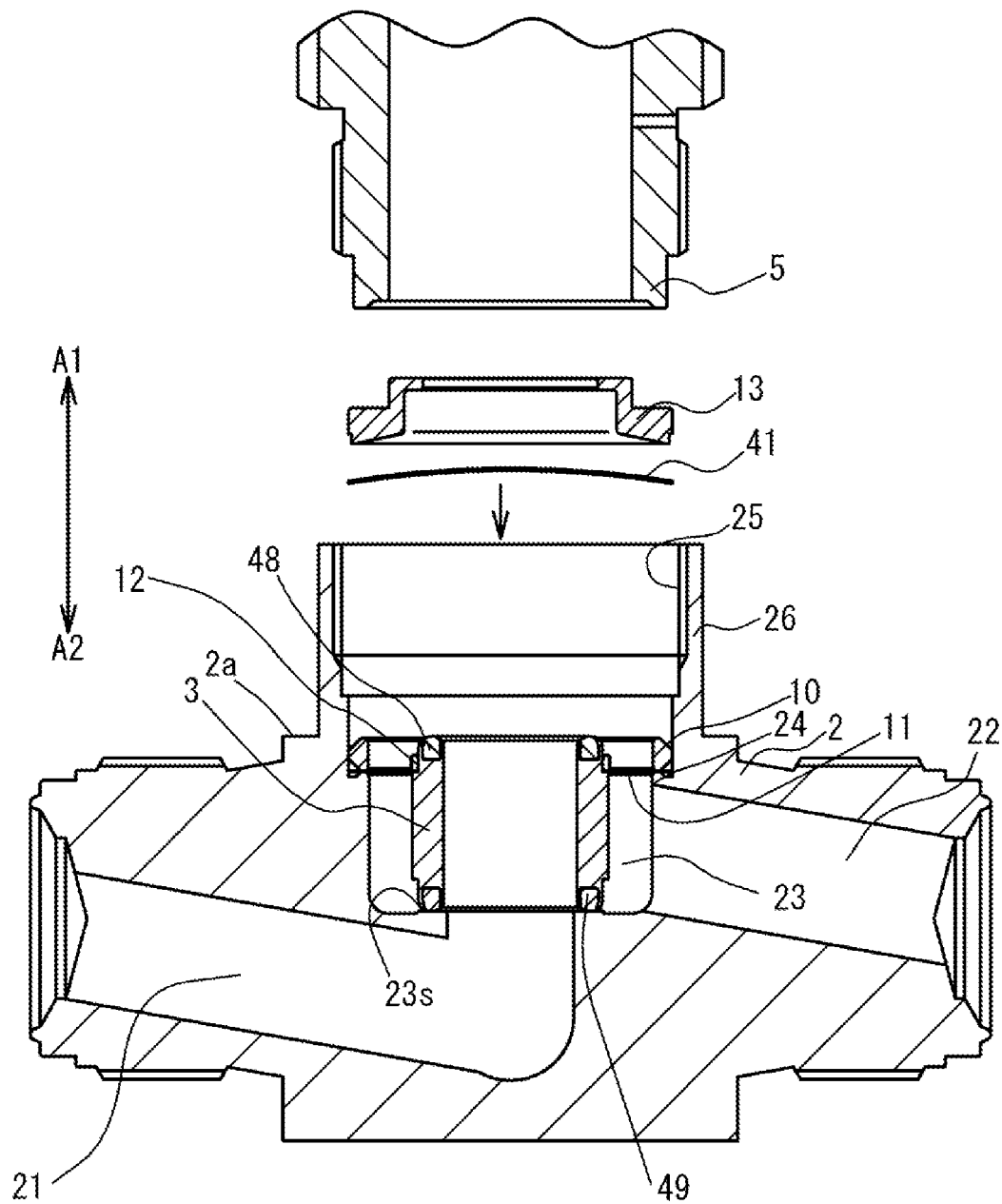

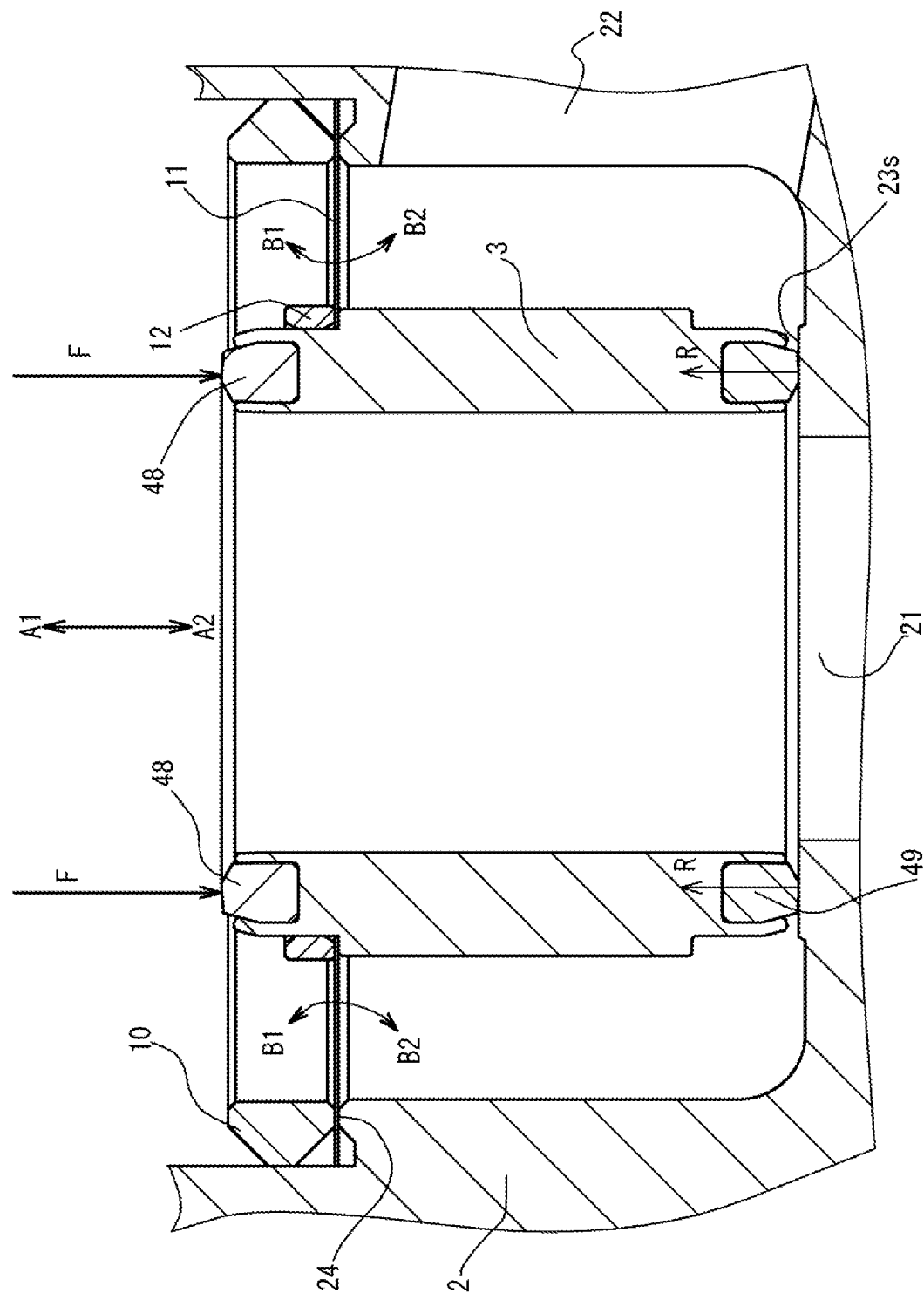
[fig.7]

[fig.8A]
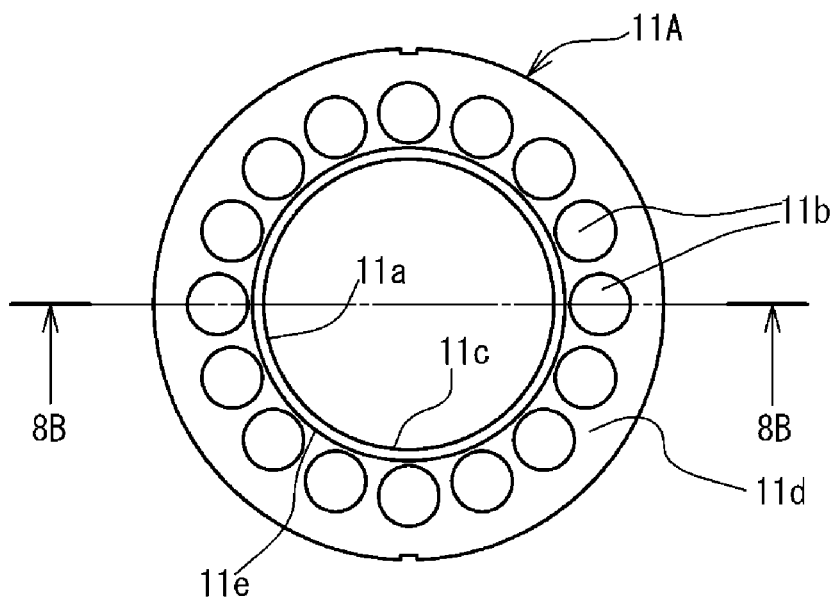
[fig.8B]
[fig.8C]
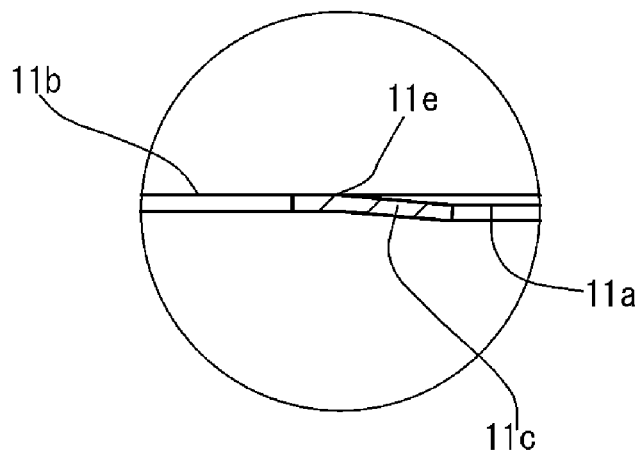

[fig.9A]
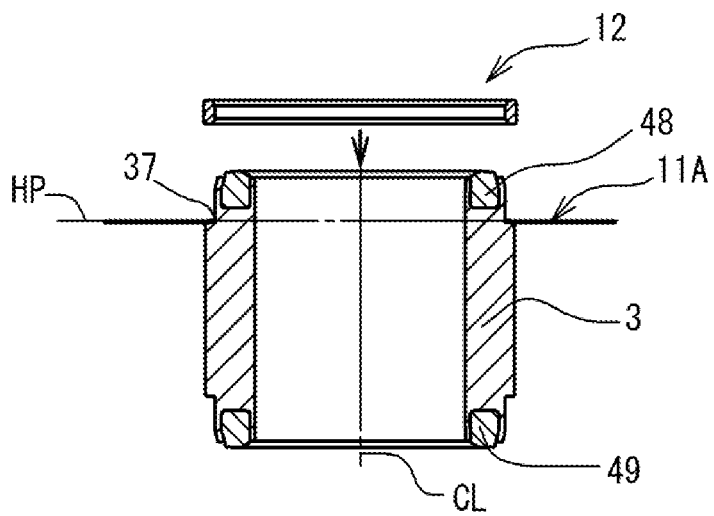
[fig.9B]
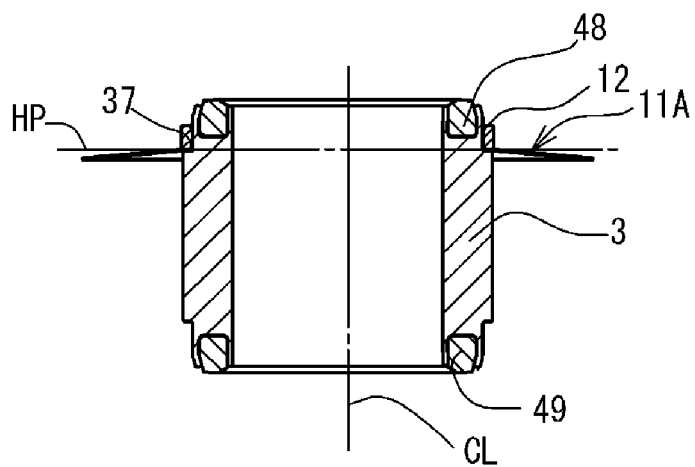

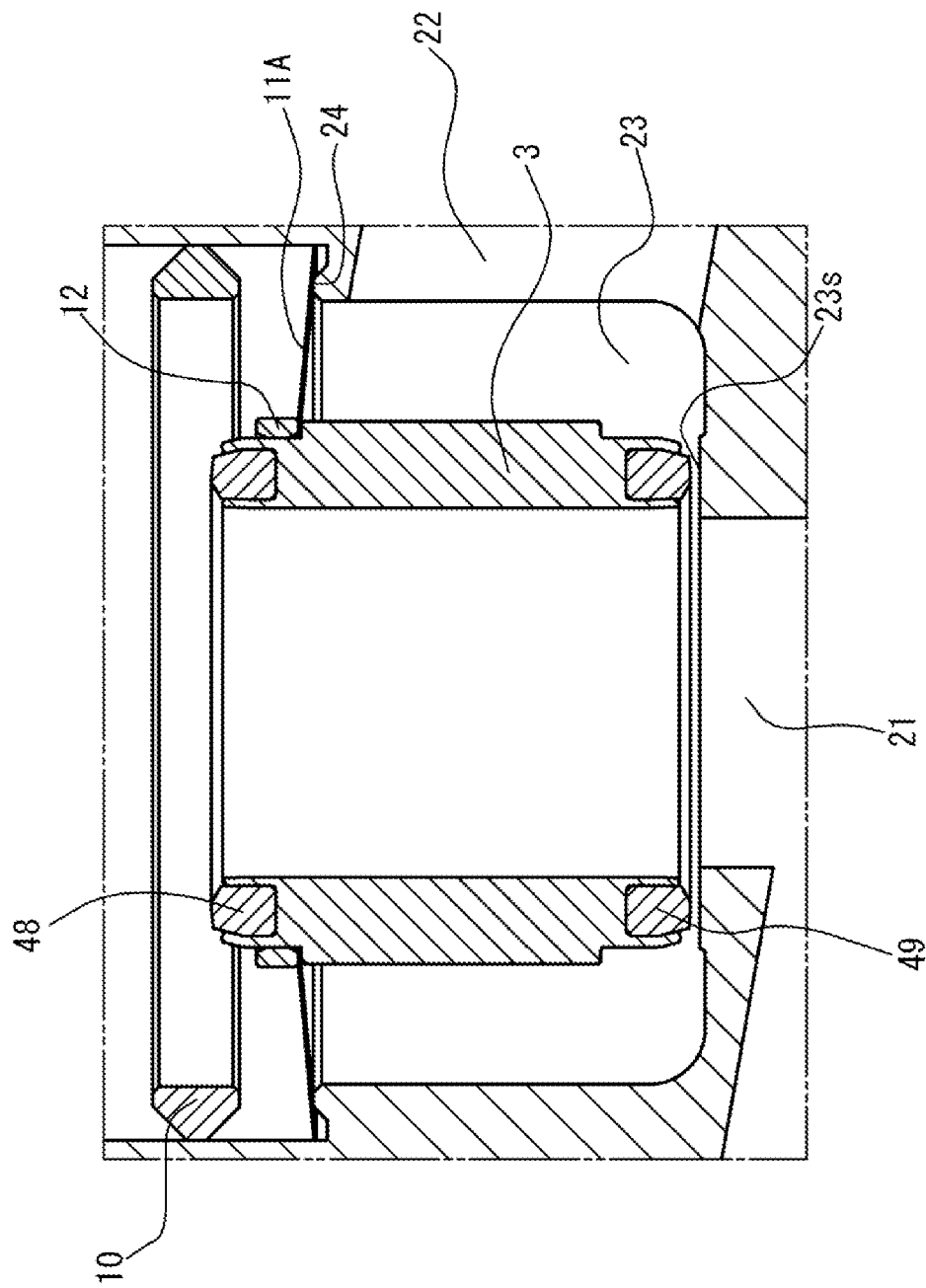
[fig.10A]

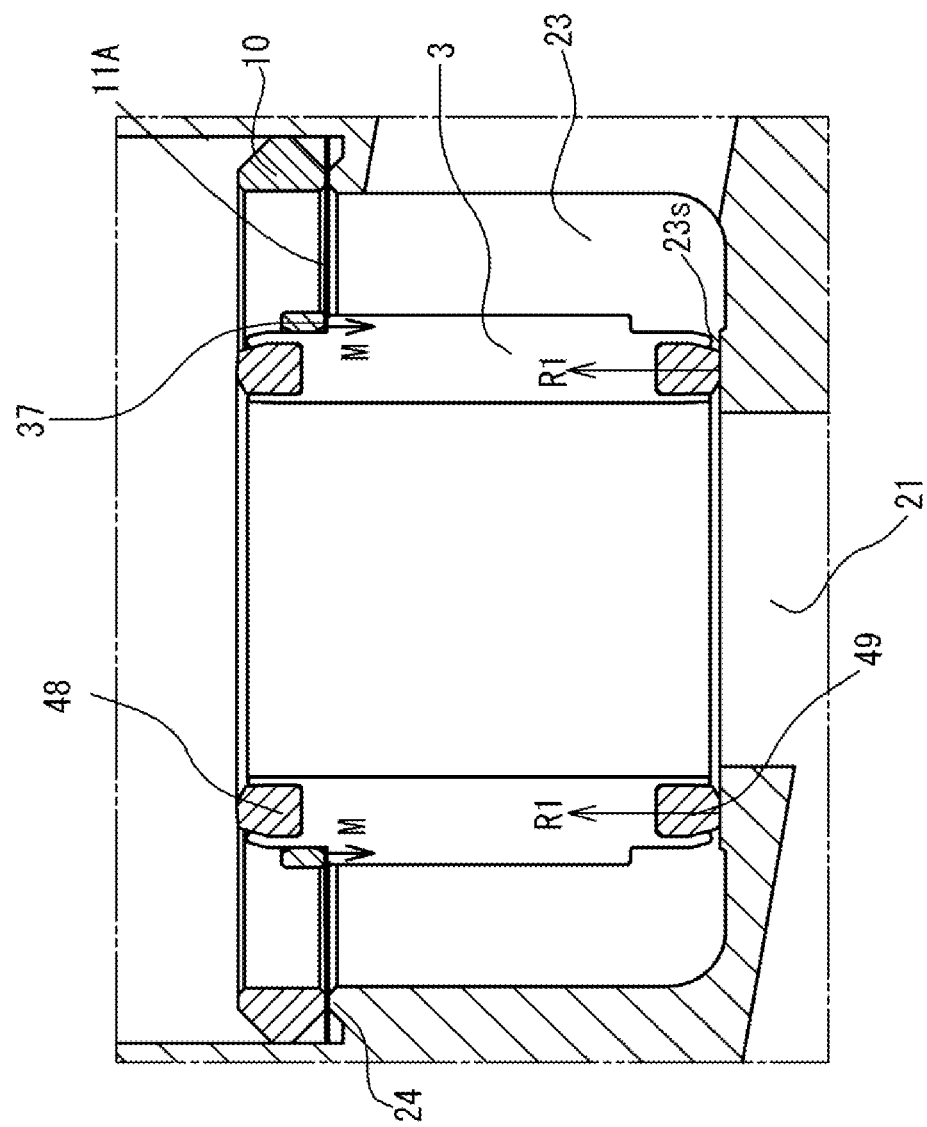

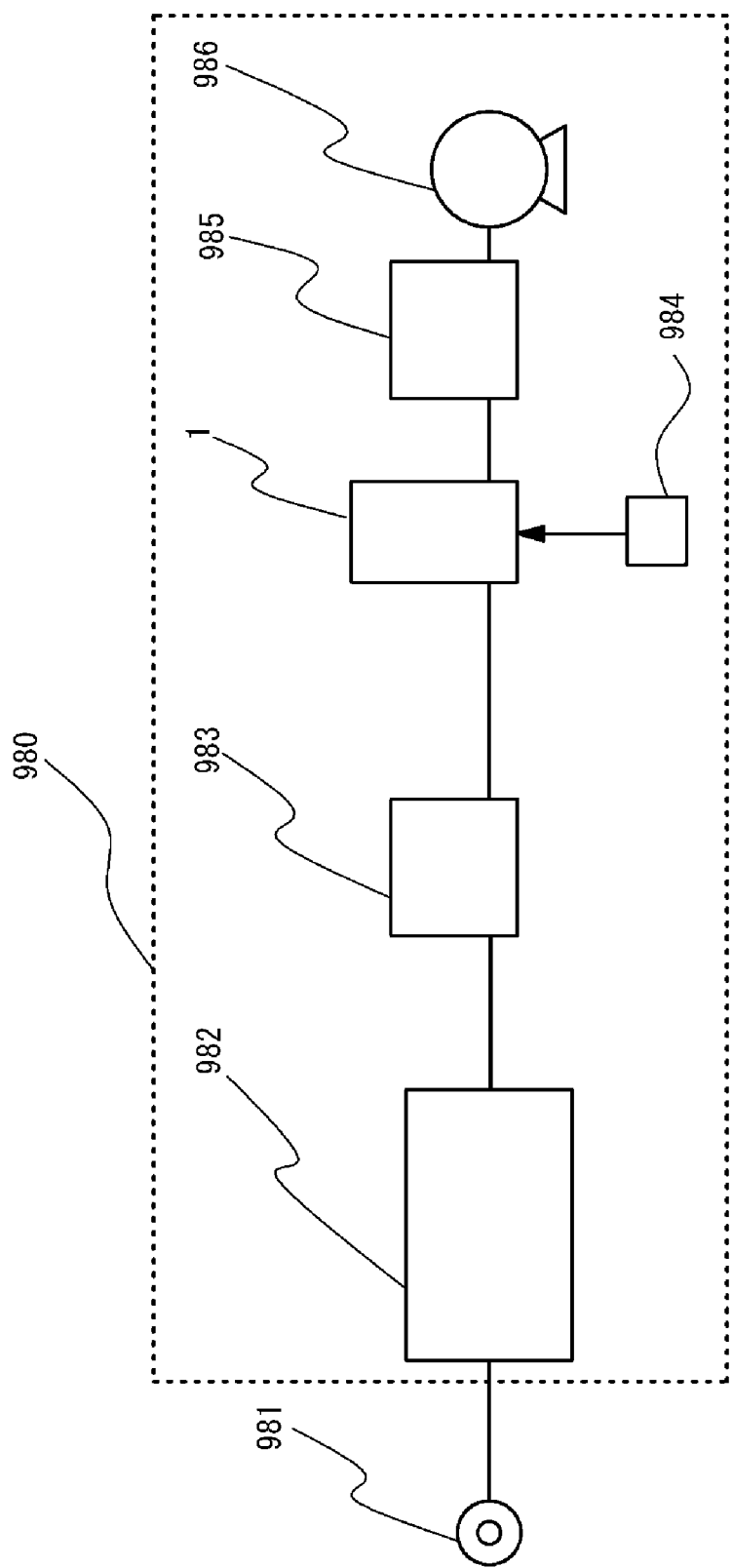
[fig.11]

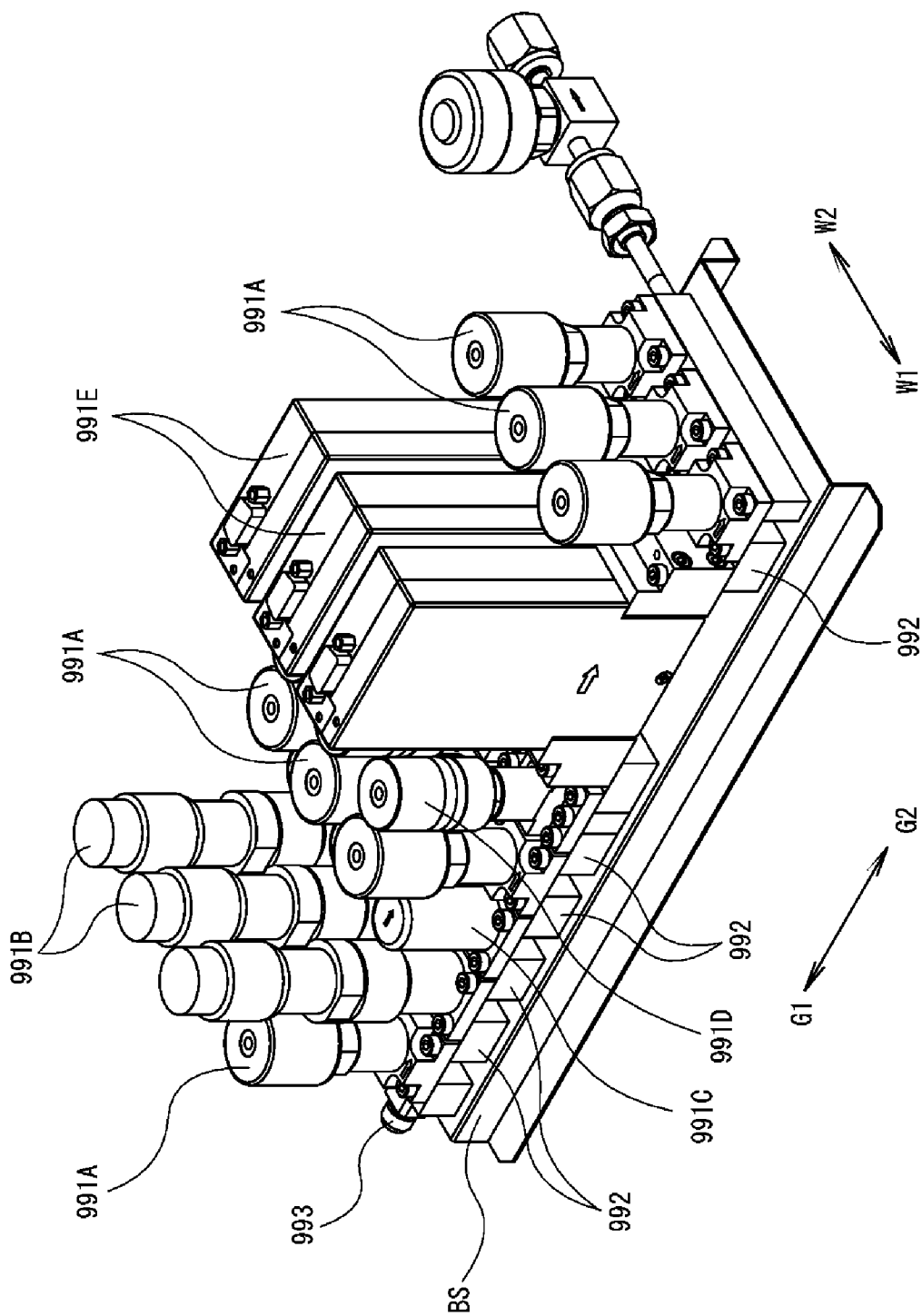
[fig.12]

VALVE DEVICE, FLUID CONTROL DEVICE, FLUID CONTROL METHOD, SEMICONDUCTOR MANUFACTURING APPARATUS, AND SEMICONDUCTOR MANUFACTURING METHOD

TECHNICAL FIELD

The present invention relates to a valve device, a fluid control device, a fluid control method, a semiconductor manufacturing apparatus, and a semiconductor manufacturing method.

BACKGROUND ART

For example, in a semiconductor manufacturing process, valve devices are used to control supply of various process gases to chambers of semiconductor manufacturing apparatuses. In the atomic layer deposition method (ALD method) or the like, there is a demand for a valve device which is miniaturized and can stably supply a process gas used in a process of depositing a film on the substrate at a larger flow rate.

Patent Literature 1 discloses a diaphragm valve which is miniaturized and can stably supply a process gas at a higher flow rate. A recess of a main body of the diaphragm valve is composed of a large diameter portion close to the opening and a small diameter portion continuous below the large diameter portion through a step portion. A flow path forming disk is fitted in the recess. The flow path forming disk consists of a large diameter cylindrical portion fitted to the recess large diameter portion, a connecting portion which is received by the recess step portion, and a small diameter cylindrical portion which has an outer diameter smaller than the inner diameter of the recess small diameter portion and has a lower end received by bottom surface of the recess. A plurality of through holes are formed in the connecting portion of the flow path forming disk to make the outer annular space of the small-diameter cylindrical portion communicate with the inner annular space of the large-diameter cylindrical portion. A fluid inflow passage communicates with the lower end of the small diameter cylindrical portion of the flow path forming disk and a fluid outflow passage communicate with the outer annular space of the small diameter cylindrical portion, respectively.

Patent Literature

PTL 1: Japanese Laid-Open Patent Application No. 2005-172026

SUMMARY OF INVENTION

Technical Problem

In the diaphragm valve described above, two locations must be sealed, that are between the recess step portion of the body of the diaphragm valve and the large diameter cylindrical portion of the flow path forming disk, and between the bottom surface of the recess of the body of the diaphragm valve and the lower end of the flow path forming disk. For this reason, there was a problem that the sealing performance between the lower end of the flow path forming disk and bottom surface of the recess of the body of the diaphragm valve varied among several diaphragm valves due to dimensional errors among the components, etc.

One of the objects of the present invention is to provide a valve device having improved sealing performance, which is miniaturized and enables more stable control of a large flow rate, and a fluid control device, a fluid control method, a semiconductor manufacturing apparatus, and a semiconductor manufacturing method using the valve device.

Solution to Problem

The valve device of the present invention comprises:
a valve body defining an accommodation recess, a first flow path which opens to a bottom surface of the accommodation recess, and a second flow path connected to the accommodation recess;
a cylindrical member provided in the accommodation recess and defining a flow path in communication with the first flow path;
a valve seat having an annular shape and supported by an upper end portion of the cylindrical member,
a seal member having an annular shape and interposed between an opening periphery of the first flow path and the lower end of the cylindrical member of bottom surface of the accommodation recess;
an annular plate that is flexible and has an outer peripheral edge portion air-tightly or liquid-tightly fixed to an annular support portion formed on an inner peripheral surface of the accommodation recess of the valve body, an inner peripheral edge portion air-tightly or liquid-tightly fixed to an annular support portion formed on an outer peripheral surface of the cylindrical member, and a plurality of openings communicating with the second flow path through the accommodation recess; and
a diaphragm that covers the valve seat on the cylindrical member and the annular plate and moves between an open position at which the diaphragm does not contact the valve seat and a closed position at which the diaphragm contacts the valve seat to enable and block communication between the first flow path and the second flow path.

The cylindrical member is supported in a cantilever manner by the annular plate so that a force received from the diaphragm through the valve seat can be transmitted as a force pressing the seal member toward bottom surface of the accommodation recess.

A configuration may be adopted in which the valve device further comprises an urging mechanism that urges the cylindrical member toward the bottom surface of the accommodation recess to press the seal member against the bottom surface.

Preferably, the annular plate also serves as the urging mechanism which provides an elastic restoring force exerted by the annular plate.

A configuration may be adopted in which the outer peripheral edge portion of the annular plate contacts a support portion formed on the inner peripheral surface of the accommodation recess and a support ring inserted into the inner peripheral surface so as to oppose the support portion,
an outer peripheral edge portion of the diaphragm is disposed on the support ring, and
a surface of the outer peripheral edge portion of the diaphragm opposite to the support ring side is pressed by a presser adapter so that an outer peripheral edge portion of the support ring and the outer peripheral edge portion of the diaphragm are fixed to the support portion.

A configuration may be adopted in which the inner peripheral edge portion of the annular plate is inserted into the outer peripheral surface of the cylindrical member so as to face a support portion formed on the outer peripheral surface of the cylindrical member, and is fixed to the support portion formed on the outer peripheral surface of the cylindrical member by a fixing ring press-fitted into the outer peripheral surface so as to face the support portion via the inner peripheral edge portion of the annular plate.

A configuration may be adopted in which the annular plate is made of metal, and has a bent portion bent in a middle in a radial direction, so that when fixed to the support portion formed on the inner peripheral surface of the accommodation recess and the support portion formed on the outer peripheral surface of the cylindrical member, the bent portion is fixed so as to be warped, whereby the cylindrical member is urged toward the bottom surface of the accommodation recess to exert an elastic urging force for urging the seal member to the bottom surface.

A configuration may be adopted in which the seal member is held in a seal recess formed on the valve body side of the cylindrical member.

A configuration may be adopted in which the cylindrical member has a valve seat recess formed on the diaphragm side, the valve seat is held in the valve seat recess, and the valve seat has the same material and shape as the seal member.

The fluid control device of the present invention is a fluid control device comprising a plurality of fluid device arranged from an upstream side toward a downstream side, wherein the plurality of fluid device comprises the above valve device.

The flow rate control method of the present invention is a flow rate control method comprising adjusting a flow rate of fluids by using the valve device described above.

The semiconductor manufacturing apparatus of the present invention is a semiconductor manufacturing apparatus comprising the above valve device to control a process gas in a manufacturing process of a semiconductor device that requires a processing process using the process gas in a sealed chamber.

The semiconductor manufacturing method of the present invention is a semiconductor manufacturing method comprising using the above valve device to control a flow rate of a process gas in a manufacturing process of a semiconductor device that requires a processing process using the process gas in a sealed chamber.

Advantageous Effects of Invention

According to the present invention, a valve device is provided, which has improved sealing performance, which is miniaturized and enables more stable control of large flow rate.

BRIEF DESCRIPTION OF DRAWINGS

FIG. 1A is a longitudinal cross-sectional view showing a configuration of a valve device according to an embodiment of the present invention.

FIG. 1B is a cross-sectional view showing an open state of the valve device in FIG. 1A.

FIG. 2A is a top view of a cylindrical member for holding a valve seat and a sealing member.

FIG. 2B is a cross-sectional view of the cylindrical member along line 2B-2B of FIG. 2A.

FIG. 3 is a plan view of an annular plate.

FIG. 4A is a plan view of a fixing ring.

FIG. 4B is a cross-sectional view of the fixing ring along line 4B-4B of FIG. 4A.

FIG. 5 is a cross-sectional view of a cylindrical member on which the annular plate is mounted.

FIG. 6 is a cross-sectional view illustrating an assembly procedure of the valve device in FIG. 1A.

FIG. 7 is an enlarged cross-sectional view of the main part of the valve device in FIG. 1A.

FIG. 8A is a plan view of an annular plate of the valve device according to another embodiment of the present invention.

FIG. 8B is a cross-sectional view of the annular plate along line 8B-8B of FIG. 8A.

FIG. 8C is an enlarged cross-sectional view in a circle A in FIG. 8B.

FIG. 9A is a cross-sectional view showing a state before the annular plate is fixed to the cylindrical member.

FIG. 9B is a cross-sectional view showing a state after the annular plate is fixed to the cylindrical member by a fixing ring.

FIG. 10A is a cross-sectional view showing a state in which the cylindrical member to which the annular plate is fixed is inserted into the accommodating recess.

FIG. 10B is a cross-sectional view showing a state in which the annular plate is fixed to the support portion of the accommodating recess.

FIG. 11 is a schematic diagram showing an application of the valve device according to an embodiment of the present invention to a semiconductor manufacturing process.

FIG. 12 is a perspective view showing an exemplary fluid control device using the valve device of the present embodiment.

DESCRIPTION OF EMBODIMENTS

First Embodiment

Embodiments of the present disclosure will be described below with reference to the drawings. In the description, the same elements are denoted by the same reference numerals, and repetitive descriptions are omitted as appropriate.

First, referring to FIG. 12, an exemplary fluid control device to which the present invention is applied will be described.

In the fluid control device shown in FIG. 12, a metallic base plate BS is provided which extends in the longitudinal direction G1, G2 and is arranged along the width direction W1, W2. Note that W1 represents the rear side, W2 represents the front side, G1 represents the upstream side, and G2 represents the downstream side. Various fluid devices 991A to 991E are installed on the base plate BS via a plurality of flow path blocks 992, and a flow path (not shown) through which fluids flow from the upstream side G1 to the downstream side G2 is formed by the plurality of flow path blocks 992.

The term "fluid device" is a device used in a fluid control device for controlling flow of a fluid, which includes a body defining a fluid flow path, and has at least two flow path ports opening on the surface of the body. Specific examples include, but are not limited to, an open-close valve (two-way valve) 991A, a regulator 991B, a pressure gauge 991C, an open-close valve (three-way valve) 991D, a mass flow controller 991E, and the like. An introducing pipe 993 is connected to an upstream flow path port of the flow path (not shown).

Although the present invention is applicable to various valve devices such as the above-described open-close valves 991A and 991D and the regulator 991B, the present invention will be described by exemplifying an application to open-close valves.

FIG. 1A is a cross-sectional view showing the configuration of the valve device 1 in an open state according to an embodiment of the present invention. FIG. 1B is a cross-sectional view showing an open state in the valve device 1 of FIG. 1. As shown in FIGS. 1A, 1B, the valve device 1 includes a casing 6, a bonnet 5, a valve body 2, a cylindrical member 3 formed in a cylindrical shape, a valve seat 48, a seal member 49, a support ring 10, an annular plate 11, a fixing ring 12, a diaphragm 41, a presser holder 43, a diaphragm presser 42, a stem 44, and a coil spring 45.

It is assumed that arrows A1 and A2 in the drawing indicate the vertical direction, A1 indicates the upward direction, and A2 indicates the downward direction.

The valve body 2 is made of stainless steel and has an upper surface 2a and side surfaces 2b and 2c facing each other. A cylindrical portion 26 extends in the upward direction A1 from the upper surface 2a. Inside the cylindrical portion 26, there opens an accommodation recess 23 which is a space for arranging the cylindrical member 3 and has a stepped support portion 24, and there is formed a screw hole 25 which is screwed with the bonnet 5. The valve body 2 forms a first flow path 21 and a second flow path 22. The first flow path 21 is a flow path that opens at a side surface 2b and a bottom surface of the accommodation recess 23. The second flow path 22 is a flow path that opens at a side surface 2c and a side surface of the accommodation recess 23.

The diaphragm 41 has an outer peripheral edge portion that is sandwiched by a support ring 10 which will be described later and a presser adapter 13, and moves between a closed position at which the diaphragm contacts with the valve seat 48 and an open position at which the diaphragm does not contact with the valve seat 48 to connect and disconnect the first flow path 21 and the second flow path 22. The casing 6 houses an actuator 8 for driving the diaphragm 41 and is fixed by being screwed into the bonnet 5. The operating member 7 moves between a closed position at which the diaphragm 41, which is a valve body, closes the opening of the first flow path 21 and an open position at which it opens the opening. The operating member 7 of the actuator 8 is formed in a substantially cylindrical shape, is held by the inner peripheral surface of the circular hole 54 of the bonnet 5 and the inner peripheral surface of the circular hole 64 formed in the casing 6, and is supported movably in the vertical directions A1 and A2. An O-ring 91 is arranged between the inner peripheral surfaces of the circular holes 54 and 64 and the operating member 7 to ensure airtightness.

Inside the bonnet 5, the operating member 7 is coupled to the stem 44, which moves with the operating member 7. The stem 44 is biased in the interior of the bonnet 5 by a coil spring 46 in a downward direction A2 relative to the bonnet 5, that is, in a direction to move the diaphragm 41 to the closed position. In the present embodiment, the coil spring 46 is used, but the present invention is not limited thereto, and other types of elastic members such as a disc spring or a leaf spring can be used. A presser holder 43 is fixed to the lower end surface of the stem 44, and a diaphragm presser 42 made of a synthetic resin such as polyimide in contact with the upper surface of the central portion of the diaphragm 41 is mounted on the presser holder 43. A metal such as aluminum may be used for the diaphragm presser 42.

Inside the casing 6, an annular bulkhead 82 is formed around the operating member 7, a piston 81 is disposed in a cylinder 83 sandwiched between an upper surface 5a of the bonnet 5 and the bulkhead 82, and another piston 81 is disposed in another cylinder 83 formed above the bulkhead 82. The upper piston 81 is biased toward the lower direction A2 by a coil spring 45.

O-rings 91 are arranged between the inner peripheral surface forming a space inside the casing 6 and the pistons 81, and between the operating member 7 and the pistons 81 to ensure airtightness.

The cylinders 83 and the pistons 81 constitute an actuator 8 which moves the operating member 7 to the open position against the coil spring 46. The actuator 8 may be configured to increase the force of the operating gas, for example, by increasing the working area of the pressure using a plurality of pistons 81. The space above the upper piston 81 is open to the atmosphere through a vent passage 62 or the like.

The space below the piston 81 of each cylinder 83 communicates with an operating member flow passage 71 formed in the operating member 7. The operating member flow passage 71 communicates with the operating gas supply port 61 connected a circular hole 64 formed in the upper surface 6a of the casing 6. Thus, the operation gas supplied from the operating gas supply port 61 is supplied to the cylinders 83, pushing the pistons 81 upward A1. Incidentally, the configurations of the casing 6, the actuator 8, the bonnet 5, the stem 44, the diaphragm presser 42, the coil springs 45, 46 are each an example of configuration in an automatic valve device that controls the opening and closing of the valve body by compressed air, and these configurations can be appropriately selected from known configurations. These configurations may not be provided in the case of a manual valve device or the like.

The cylindrical member 3 is formed in a cylindrical shape by a metallic material such as stainless steel, and defines a flow path 3a which communicates with the opening of the first flow path 21 on the bottom surface of the accommodation recess 23. As shown in FIGS. 2A, 2B, a holding recess 35 is formed in the upper end portion of the cylindrical member 3, a holding recess 36 is formed in the lower end portion. A valve seat 48 is fixed to the holding recess 35, and an annular seal member 49 is fixed to the holding recess 36 by swaging. Respective step portions 37 are formed on the upper end portion and the lower end portion of the outer peripheral surface of the cylindrical member 3.

The seal member 49 isolates the inside and outside of the cylindrical member 3 on the valve body 2 side of the cylindrical member 3 to ensure airtightness.

The valve seat 48 is formed of a synthetic resin such as PFA, PA, PI, PCTFE or PTFE, and the seal member 49 may be formed of the same material and shape as the valve seat 48. According to this configuration, the cylindrical member 3 to which the valve seat 48 and the seal member 49 are fitted can be used in either of the vertical directions. It is also possible to reduce the product cost by standardizing the parts. Incidentally, a configuration in which the valve seat 48 and the seal member 49 are not fixed to the cylindrical member 3 can also be employed, and a configuration in which the valve seat 48 and the seal member 49 are not made of the same material and have the same shape can also be adopted.

The annular plate 11 is, as shown in FIG. 3, a flexible annular flat plate having a through hole 11a in the central portion, which is formed of a metal such as stainless steel, and has a plurality of openings 11b formed in the circumferential direction. In the annular plate 11, as described later, the inner peripheral edge portion 11c is fixed to the stepped portion 37 formed on the outer peripheral surface of the cylindrical member 3, and the outer peripheral edge portion 11d is fixed to the support portion 24 of the accommodation recess 23.

The support ring 10 has an annular shape concentric with the cylindrical member 3. The support ring 10 is disposed on the stepped support portion 24 of the accommodation recess 23 via the outer peripheral edge portion 11d of the annular plate 11.

The fixing ring 12 has an annular shape concentric with the cylindrical member 3, and as shown in FIG. 4B, the upper and lower end surfaces 12a are constituted by a flat surface parallel to each other. As shown in FIG. 5, the annular plate 11 is disposed on the stepped portion 37 of the upper end side of the cylindrical member 3, and the fixing ring 12 is press-fitted to the outer peripheral surface of the upper end side of the cylindrical member 3. As a result, the annular plate 11 is fixed to the cylindrical member 3.

In the present embodiment, in the cylindrical member 3, a flow path 3a inside the cylindrical member 3 communicates with the first flow path 21. Since the opening of the first flow path 21 can be provided on the bottom surface of the accommodation recess 23 and the opening of the second flow path 22 can be provided on the side surface of the accommodation recess 23, the diameters of the first flow path 21 and the second flow path 22 can be made larger. This makes it possible to increase the flow rate in the open state.

The diaphragm 41 closes a flow path 3a of the cylindrical member 3 extending from the first flow path 21 of the valve body 2 to disconnect the first flow path 21 and the second flow path 22, and opens the flow path 3a to connect the first flow path 21 and the second flow path 22. The diaphragm 41 is disposed above the valve seat 48 to maintain the airtightness of the accommodation recess 23, and disconnect or connect the first flow path 21 and the second flow path 22 when the central portion thereof moves down and up to be seated on and off the valve seat 48. In the present embodiment, the diaphragm 41 has a spherical shell shape in which an upward convex arcuate shape in natural state formed by bulging upward a central portion of a metal sheet of special stainless steel or the like and a nickel-cobalt alloy sheet. The diaphragm 41 is formed of, for example, a metal such as stainless steel or a NiCo based alloy or fluorine-based resin so as to be elastically deformable in a spherical shell.

In the valve device 1, as shown in FIG. 6, the cylindrical member 3 to which annular plate 11 shown in FIG. 5 is fixed by the fixing ring 12 is arranged so that the seal member 49 contacts the annular sealing surface 23s around the opening of the first flow path 21 formed on the bottom surface of the accommodation recess 23. The support ring 10 is then positioned to contact the annular plate 11, and thereafter the diaphragm 41 is positioned to contact the support ring 10, the presser adapter 13 is positioned to contact the diaphragm 41, and the bonnet 5 is screwed into a screw hole 25 of the valve body 2. By the lower end surface of the bonnet 5, the presser adapter 13 is pressed in the downward direction A2, and the outer peripheral edge portion 11d of the annular plate 11 is pressed against the support portion 24 of the accommodation recess 23 of the valve body 2 via the diaphragm 41 and the support ring 10. Thus, the outer peripheral edge portion 11d of the annular plate 11 is air-tightly or liquid-tightly fixed to the support portion 24 of the accommodation recess 23 of the valve body 2. Incidentally, the inner peripheral edge portion 11c of the annular plate 11 is air-tightly or liquid-tightly fixed by a fixing ring 12 to the stepped portion (support portion) 37 formed on the outer peripheral surface of the cylindrical member 3.

Here, the force acting on the cylindrical member 3 of the valve device 1 will be described with reference to FIG. 7.

Although FIG. 7 shows a state in which the annular plate 11 is fixed to the support portion 24, the diaphragm 41 and bonnet 5 are not shown.

The outer peripheral edge portion of the annular plate 11 is sandwiched by the flat surface of the support portion 24 of the valve body 2 and the flat surface of the support ring 10, so that the cylindrical member 3 is supported in a cantilever manner by the annular plate 11. The annular plate 11 can be deflected in the direction of arrows B1 and B2, and by the deflection of the annular plate 11, the cylindrical member 3 is movable in the vertical direction A1, A2 with respect to the bottom surface of the accommodation recess 23.

When the diaphragm 41 (not shown) is pressed in the downward direction A2 and comes into close contact with the valve seat 48, a force F toward the downward direction A2 acts on the valve seat 48. Thus, the seal member 49 provided on the lower end portion of the cylindrical member 3 receives a reaction force R of the force F received from the diaphragm 41 from the sealing surface 23s around the opening of the first flow path 21 of the accommodation recess 23. By the reaction force R acts on the seal member 49 from the sealing surface 23s, the seal member 49 is brought into close contact with the sealing surface 23s, and at the bottom surface of the accommodation recess 23, reliable sealing is provided between the inner peripheral side and the outer peripheral side of the cylindrical member.

That is, in the closed state shown in FIG. 1, the valve device 1 can reliably prevent leakage between the cylindrical member 3 and the bottom surface of the accommodation recess 23.

Second Embodiment

FIGS. 8A to 8C show the construction of an annular plate 11A used in a valve device according to a second embodiment of the present invention. The valve device according to the second embodiment has the same structure as the valve device 1 according to the first embodiment except for the structure of the annular plate 11A.

The annular plate 11A shown in FIG. 8A is a flexible annular plate material having a through hole 11a in the central portion, which is made of a metal such as stainless steel, and has a plurality of openings 11b in the circumferential direction. In addition, the annular plate 11A has a bent portion 11e between the inner peripheral edge portion 11c and the outer peripheral edge portion 11d.

As can be seen from FIG. 8C, in the annular plate 11A, a portion of the inner peripheral edge portion 11c (middle in the radial direction) is plastically deformed in advance along a circle concentric with the annular plate 11A so that the portion of the inner peripheral edge portion 11c on the inner peripheral side of the bent portion 11e faces downward in the central axis direction of the annular plate 11A.

As shown in FIG. 9A, the through hole 11a of the annular plate 11A is fitted into the outer peripheral surface of the cylindrical member 3 and the annular plate 11A is disposed on the stepped portion 37. In this state, the annular plate 11A is disposed at a position substantially along a horizontal plane HP perpendicular to the central axis CL of the cylindrical member 3.

From this state, as shown in FIG. 9B, when the fixing ring 12 is press-fitted to the outer peripheral surface of the upper end portion of the cylindrical member 3, and the inner peripheral edge portion 11c of the annular plate 11A is sandwiched by a flat end surface of the fixing ring 12 and a flat support surface of the stepped portion 37, the annular plate 11A is warped downward with respect to the horizontal plane HP.

When the cylindrical member 3 shown in FIG. 9B to which the annular plate 11A is fixed is inserted into the accommodation recess 23 of the valve body 2, as shown in FIG. 10A, the annular plate 11A is disposed on the support portion 24 in a state of being inclined downward toward the outer peripheral side.

From this state, the support ring 10 is disposed on the annular plate 11A, the diaphragm 41 and the presser adapter 13 (not shown) is further disposed on the support ring 10, and the presser adapter 13 is pressed in the downward direction A2 by the lower end surface of bonnet 5, so that the outer peripheral edge portion of the annular plate 11A and the outer peripheral edge portion of the diaphragm 41 are air-tightly or liquid-tightly fixed between the support portion 24 and the lower end surface of the bonnet 5.

FIG. 10B shows a state in which the annular plate 11A is fixed to the support portion 24, but the diaphragm 41 and the bonnet 5 are not shown. Further, for convenience of explanation, hatching to cross sections of the cylindrical member 3 is omitted.

In the state shown in FIG. 10B, although the annular plate 11A extends in the horizontal direction, a bending moment M from the annular plate 11A in the downward direction A2 always acts on the upper end portion of the cylindrical member. That is, when the annular plate 11A is fixed to the stepped portion (support portion) 37 formed on the outer peripheral surface of the support portion 24 and the cylindrical member 3 of the accommodation recess 23, the annular plate is fixed so as to warp the bent portion 11e of the annular plate 11A, and the annular plate 11A exerts an elastic biasing force that urges the cylindrical member 3 toward the bottom surface of the accommodation recess 23 and presses the seal member 49 against the sealing surface 23s. A reaction force R1 constantly acts on the seal member 49 from the sealing surface 23s. With such a configuration, when the valve device is in the open state and the fluid is flowing, and when there occurs a pulsation (pressure fluctuation) in the fluid, there is a possibility that the cylindrical member 3 causes the so-called chattering to move up and down with respect to the sealing surface 23s. However, by the biasing mechanism, by exerting an elastic biasing force on the annular plate 11A to press the seal member 49 against the sealing surface 23s, it is possible to suppress chattering. It is also possible to provide a biasing mechanism for biasing the cylindrical member 3 toward the bottom surface of the accommodation recess 23 separately from the annular plate 11A, but by providing the annular plate 11A also with the biasing function, it is possible to simplify the structure.

Next, referring to FIG. 11, an application of the above-described valve device 1 will be described.

The semiconductor manufacturing apparatus 980 shown in FIG. 11 is a device for performing a semiconductor manufacturing process by the ALD method, in which 981 denotes a process gas supply source, 982 denotes a gas box, 983 denotes a tank, 984 denotes a controller, 985 denotes a processing chamber and 986 denotes an exhaust pump.

In the semiconductor manufacturing process by the ALD method, it is necessary to precisely adjust the flow rate of the processing gas, and it is also necessary to secure a certain amount of the flow rate of the processing gas to address increase of the diameter of the substrate.

The gas box 982 is an integrated gas system (fluid control device) in which various fluid control devices such as an open-close valve, a regulator and a mass flow controller are integrated and accommodated in a box in order to supply accurately metered process gas to the process chamber 985.

The tank 983 functions as a buffer for temporarily storing the processing gas supplied from the gas box 982.

The controller unit 984 executes the flow rate adjusting control to the valve device 1 by supply control of operating gas.

The processing chamber 985 provides a sealed processing space for forming a film on a substrate by the ALD method.

An exhaust pump 986 draws a vacuum within the processing chamber 985.

According to the system configuration as described above, by sending a command for adjusting the flow rate from the controller 984 to the valve device 1, it is possible to initially adjust the process gases.

Note that the present invention is not limited to the above-described embodiments. Various additions, modifications, and the like can be made by those skilled in the art within the scope of the present invention. For example, in the above application example, the case where the valve device 1 is used in the semiconductor manufacturing process by the ALD method has been exemplified, but the present invention is not limited to this case, and the present invention can be applied to any object requiring precise flow rate control, such as an atomic layer etching method (ALE) or the like.

In the above embodiments, a piston incorporated in the cylinder and operated by gas pressure is used as an actuator, but the present invention is not limited to this, and it is possible to select various optimal actuators according to the control object.

In the above embodiment, the valve device 1 was disposed outside of the gas box 982 as a fluid control device, but it is also possible to include the valve device 1 of the above embodiment in a fluid control device in which various fluid device such as an open-close valve, a regulator, and a mass flow controller are integrated and housed in the box.

In the above embodiment, the fluid control device in which the valve device is mounted on a plurality of flow path blocks 992 is illustrated, but the present valve device can be applied to an integrated flow path block or a baseplate in addition to the divided flow path blocks 992.

REFERENCE SIGNS LIST

1: Valve device
2: Valve body
2a: Upper surface
2b: Side surface
2c: Side surface
3: Cylindrical member
3a: Flow path
5: Bonnet
5a: Upper surface
6: Casing
6a: Upper surface
7: Operating member
8: Actuator
10: Support ring
11: Annular plate
11A: Annular plate
11a: Through hole
11b: Opening
11c: Inner peripheral edge portion 11d: Outer peripheral edge portion
11e: Bent portion
12: Fixing ring
12a: Upper and lower end faces
13: Presser adapter
21: First flow path
22: Second flow path
23: Accommodation recess
23s Sealing surface
24: Support portion
25: Screw hole
26: Cylindrical portion
35: Holding recess
36: Holding recess
37: Stepped portion
41: Diaphragm
42: Diaphragm presser
43: Presser holder
44: Stem
45: Coil spring
46: Coil spring
48: Valve seat
49: Seal member
54: Circular hole
61: Operating gas supply port
6 2: Vent passage
64: Circular hole
71: Operating member flow passage
81: Piston
82: Bulkhead
83: Cylinder
91: O-ring
980: Semiconductor manufacturing apparatus
981: Process gas source
982: Gas box
983: Tank
984: Controller
985: Processing chamber
986: Exhaust pump
991A: Open-close valve (fluid device)
991B: Regulator (fluid device)
991C: Pressure gauge (fluid device)
991D: Open-close valve (fluid device)
991E: Mass flow controller (fluid device)
992: Flow path block
993: Introduction pipe
A: Circle
A1: Upward direction
A2: Downward direction
BS: Base plate
CL: Central axis
F: Force
G1: Longitudinal direction (upstream side)
G2: Longitudinal direction (downstream side)
HP: Horizontal plane
M: Bending moment
R: Reaction force
W1, W2: Width direction

The invention claimed is:

1. A valve device comprising:
   a valve body defining an accommodation recess, a first flow path which opens to a bottom surface of the accommodation recess, a second flow path connected to the accommodation recess;
   a cylindrical structure provided in the accommodation recess and defining a flow path in communication with the first flow path;
   a valve seat having an annular shape and supported by an upper end portion of the cylindrical structure;
   a seal structure having an annular shape and interposed between an opening periphery of the first flow path and a lower end of the cylindrical structure facing the bottom surface of the accommodation recess;
   an annular plate that is flexible, and the annular plate includes:
      an outer peripheral edge portion air-tightly or liquid-tightly fixed to an annular support portion formed on an inner peripheral surface of the accommodation recess of the valve body,
      an inner peripheral edge portion air-tightly or liquid-tightly fixed to an annular support portion formed on an outer peripheral surface of the cylindrical structure, and
      a plurality of openings communicating with the second flow path through the accommodation recess; and
   a diaphragm that covers the valve seat on the cylindrical structure and the annular plate, and the diaphragm is movable between an open position at which the diaphragm does not contact the valve seat and a closed position at which the diaphragm contacts the valve seat to enable and block communication between the first flow path and the second flow path, wherein
   the cylindrical structure is supported in a cantilever by the annular plate so that a force received from the diaphragm through the valve seat is transmittable as a force pressing the seal structure toward the bottom surface of the accommodation recess.

2. The valve device according to claim 1, further comprising a flexible structure that urges the cylindrical structure toward the bottom surface of the accommodation recess to press the seal structure against the bottom surface of the accommodation recess.

3. The valve device according to claim 2, wherein the annular plate also serves as the flexible structure which provides an elastic restoring force exerted by the annular plate.

4. The valve device according to claim 3, wherein the annular plate is made of metal, and has a bent portion bent in a middle in a radial direction,
   so that when fixed to the annular support portion formed on the inner peripheral surface of the accommodation recess and the annular support portion formed on the outer peripheral surface of the cylindrical structure, the bent portion is fixed so as to be warped, whereby the cylindrical structure is urged toward the bottom surface of the accommodation recess to exert an elastic urging force to urge the seal structure to the bottom surface of the accommodation recess.

5. The valve device according to claim 1,
   wherein the outer peripheral edge portion of the annular plate contacts the annular support portion formed on the inner peripheral surface of the accommodation recess and a support ring inserted to abut the inner peripheral surface of the accommodation recess so as to oppose the annular support portion formed on the inner peripheral surface of the accommodation recess,
   an outer peripheral edge portion of the diaphragm is disposed on the support ring, and
   a surface of the outer peripheral edge portion of the diaphragm opposite to a support ring side of the diaphragm facing the support ring is pressed by a presser adapter so that an outer peripheral edge portion of the support ring and the outer peripheral edge portion of the diaphragm are fixed to the annular support portion formed on the inner peripheral surface of the accommodation recess.

6. The valve device according to claim 1, wherein the inner peripheral edge portion of the annular plate is inserted to abut the outer peripheral surface of the cylindrical structure so as to face the annular support portion formed on the outer peripheral surface of the cylindrical structure, and is fixed to the annular support portion formed on the outer peripheral surface of the cylindrical structure by a fixing ring press-fitted to the outer peripheral surface of the cylindrical structure so as to face the annular support portion formed on the outer peripheral surface of the cylindrical structure via the inner peripheral edge portion of the annular plate.

7. The valve device according to claim 1, wherein the seal structure is held in a seal recess formed on a valve body side of the cylindrical structure facing the valve body.

8. The valve device according to claim 7, wherein the cylindrical structure has a valve seat recess formed on a diaphragm side of the cylindrical structure facing the diaphragm,
the valve seat is held in the valve seat recess, and
the valve seat comprises a same material and shapes as the seal structure.

9. A fluid control device comprising a plurality of fluid devices,
wherein at least one of the plurality of fluid devices comprises the valve device defined in claim 1.

10. A fluid control method comprising controlling a fluid using the valve device as defined in claim 1.

11. A valve device comprising:
a valve body defining an accommodation recess, a first flow path which opens to a bottom surface of the accommodation recess, a second flow path connected to the accommodation recess;
a cylindrical structure provided in the accommodation recess and defining a flow path in communication with the first flow path;
a valve seat having an annular shape and supported by an upper end portion of the cylindrical structure;
a seal structure having an annular shape and interposed between an opening periphery of the first flow path and a lower end of the cylindrical structure facing the bottom surface of the accommodation recess;
an annular plate that is flexible, and the annular plate includes:
an outer peripheral edge portion air-tightly or liquid-tightly fixed to an annular support portion formed on an inner peripheral surface of the accommodation recess of the valve body,
an inner peripheral edge portion air-tightly or liquid-tightly fixed to an annular support portion formed on an outer peripheral surface of the cylindrical structure, and
a plurality of openings communicating with the second flow path through the accommodation recess;
a diaphragm that covers the valve seat on the cylindrical structure and the annular plate, and the diaphragm is movable between an open position at which the diaphragm does not contact the valve seat and a closed position at which the diaphragm contacts the valve seat to enable and block communication between the first flow path and the second flow path; and
a flexible structure that urges the cylindrical structure toward the bottom surface of the accommodation recess to press the seal structure against the bottom surface of the accommodation recess, wherein
the annular plate also serves as the flexible structure which provides an elastic restoring force exerted by the annular plate.

12. A valve device comprising:
a valve body defining an accommodation recess, a first flow path which opens to a bottom surface of the accommodation recess, a second flow path connected to the accommodation recess;
a cylindrical structure provided in the accommodation recess and defining a flow path in communication with the first flow path;
a valve seat having an annular shape and supported by an upper end portion of the cylindrical structure;
a seal structure having an annular shape and interposed between an opening periphery of the first flow path and a lower end of the cylindrical structure facing the bottom surface of the accommodation recess;
an annular plate that is flexible, and the annular plate includes:
an outer peripheral edge portion air-tightly or liquid-tightly fixed to an annular support portion formed on an inner peripheral surface of the accommodation recess of the valve body,
an inner peripheral edge portion air-tightly or liquid-tightly fixed to an annular support portion formed on an outer peripheral surface of the cylindrical structure, and
a plurality of openings communicating with the second flow path through the accommodation recess; and
a diaphragm that covers the valve seat on the cylindrical structure and the annular plate, and the diaphragm is movable between an open position at which the diaphragm does not contact the valve seat and a closed position at which the diaphragm contacts the valve seat to enable and block communication between the first flow path and the second flow path, wherein
the inner peripheral edge portion of the annular plate is inserted to abut the outer peripheral surface of the cylindrical structure so as to face the annular support portion formed on the outer peripheral surface of the cylindrical structure, and is fixed to the annular support portion formed on the outer peripheral surface of the cylindrical structure by a fixing ring press-fitted to the outer peripheral surface of the cylindrical structure so as to face the annular support portion formed on the outer peripheral surface of the cylindrical structure via the inner peripheral edge portion of the annular plate.

* * * * *